United States Patent
Zeller

(10) Patent No.: US 10,732,236 B2
(45) Date of Patent: Aug. 4, 2020

(54) MAGNETIC RESONANCE APPARATUS AND OPERATING METHOD THEREFOR

(71) Applicant: Siemens Healthcare GmbH, Erlangen (DE)

(72) Inventor: Mario Zeller, Erlangen (DE)

(73) Assignee: Siemens Healtcare GmbH, Erlangen (DE)

( * ) Notice: Subject to any disclaimer, the term of this patent is extended or adjusted under 35 U.S.C. 154(b) by 0 days.

(21) Appl. No.: 16/274,454

(22) Filed: Feb. 13, 2019

(65) Prior Publication Data

US 2019/0250224 A1 Aug. 15, 2019

(30) Foreign Application Priority Data

Feb. 13, 2018 (EP) .................... 18156516

(51) Int. Cl.
*G01V 3/00* (2006.01)
*G01R 33/28* (2006.01)
*G01R 33/483* (2006.01)
*G01R 33/561* (2006.01)
*G01R 33/56* (2006.01)

(52) U.S. Cl.
CPC ....... *G01R 33/288* (2013.01); *G01R 33/4835* (2013.01); *G01R 33/5602* (2013.01); *G01R 33/5617* (2013.01)

(58) Field of Classification Search
USPC ........................................................ 324/309
See application file for complete search history.

(56) References Cited

U.S. PATENT DOCUMENTS

| | | | |
|---|---|---|---|
| 2015/0168524 A1* | 6/2015 | Nittka | G01R 33/56536 324/309 |
| 2015/0369891 A1 | 12/2015 | Miyazaki et al. | |
| 2017/0108567 A1 | 4/2017 | Bhat et al. | |
| 2017/0315202 A1 | 11/2017 | Bhat et al. | |
| 2018/0031659 A1 | 2/2018 | Bhat et al. | |

OTHER PUBLICATIONS

Weigel, Matthias "Entwicklung, Optimierung und klinische Erprobung von T2-gewichteten Messverfahren mit reduzierter Hochfrequenzleistung für die Kernspintomographie" Dissertation, Fakultät für Mathematik und Physik der Albert-Ludwigs-Universität Freiburg im Breisgau, Oct. 2007; and English translation.

(Continued)

*Primary Examiner* — Rodney E Fuller
(74) *Attorney, Agent, or Firm* — Schiff Hardin LLP

(57) ABSTRACT

In a magnetic resonance (MR) apparatus and an operating method therefor, MR data are acquired from a patient using an MR sequence wherein, after at least one excitation pulse, multiple refocusing pulses are radiated during a readout period. The respective strengths of the refocusing pulses proceed according to a first flip-angle variation over time that is defined so as to minimize the SAR of the patient. A multislice imaging technique is used for simultaneous excitation and readout of at least two slices of a slice group of the patient, and flip-angle variations, which differ from the first variation, are selected in order to further reduce the SAR of the patient, compared with the use of identical flip-angle variations.

18 Claims, 6 Drawing Sheets

(56) References Cited

OTHER PUBLICATIONS

Setsompop, Kawin et al. "Blipped-Controlled Aliasing in Parallel Imaging for Simultaneous Multislice Echo Planar Imaging With Reduced g-Factor Penalty" Magnetic Resonance in Medicine; vol. 67; No. 5; pp. 1210-1224; DOI 10.1002/mrm.23097.; 2012.; 2012.
Weigel, Matthias et al. "Inversion Recovery Prepared Turbo Spin Echo Sequences With Reduced SAR Using Smooth Transitions Between Pseudo Steady States" Magnetic Resonance in Medicine; vol. 57; pp. 631-637; 2007 // DOI 10.1002/mrm.21170.
Henning, Juergen et al. "Multiecho Sequences With Variable Refocusing Flip Angles: Optimization of Signal Behavior Using Smooth Transitions Between Pseudo Steady States (TRAPS)" Magnetic Resonance in Medicine, vol. 49, pp. 527-535, 2003 // DOI: 10.1002/mrm.10391.
Henning, Juergen et al. "Hyperechoes" Magnetic Resonance in Medicine, vol. 46, No. 12, pp. 6-12, 2001.
European Search Report dated Aug. 20, 2018, for European Application No. 18156516.9.

\* cited by examiner

MAGNETIC RESONANCE APPARATUS AND OPERATING METHOD THEREFOR

BACKGROUND OF THE INVENTION

Field of the Invention

The present invention concerns a method for operating a magnetic resonance MR apparatus during the acquisition of magnetic resonance data from a patient using a magnetic resonance sequence of the type wherein, after at least one excitation pulse, a number of refocusing pulses are radiated during a readout period, with the respective strengths of the refocusing pulses proceeding according to a flip-angle variation over time that is defined so as to minimize the specific absorption rate (SAR) of the patient. The invention also concerns a magnetic resonance apparatus, and an electronically readable data storage medium encoded with programming instructions that implement such a method.

Description of the Prior Art

Magnetic resonance imaging has become an established imaging modality, especially in the medical sector. Nuclear spins of a patient in a region of interest, for instance in at least one slice, are oriented in a basic magnetic field, and are excited by radiation of radio-frequency (RF) excitation signals, thereby producing magnetic resonance signals to be acquired at a later time, which can be received by suitable radio frequency coils and converted into magnetic resonance data. The excitation pulses and additional radio frequency pulses used in the course of a magnetic resonance sequence deliver electromagnetic energy into the body of the patient, and therefore the SAR load is an important factor in the development of new imaging techniques. Another aspect of current research is accelerating the imaging procedure itself in order to increase patient throughput and to make the imaging process more pleasant for the patient.

Accelerating imaging techniques that have been proposed include simultaneous multislice (SMS) imaging, in which, within one repetition of the sequence, a number of slices are excited simultaneously and read out simultaneously. An example of a specific multislice imaging technique is called "CAIPI" (Controlled Aliasing In Parallel Imaging); see, for example, the article by K. Setsompop et al., "Blipped-controlled aliasing in parallel imaging for simultaneous multislice echo planar imaging with reduced g-factor penalty", Magnetic Resonance in Medicine 67: 1210-1224 (2012).

A type of RF pulse known as a multiband excitation pulse can be used to excite a multiple slices simultaneously. For each slice to be excited, a linear phase ramp is added to the standard excitation pulse. This linear phase produces a slice shift in the spatial domain. The pulse waveforms for all the slices, i.e. bands, are summed, resulting in a baseband-modulated multiband excitation pulse. In order to reduce the g-factor drawbacks, image shifts between the slices are induced during the readout period, either by using gradient blips on the slice axis or by modulating the phase of the radio frequency pulses. After the acquisition, magnetic resonance data from all the simultaneously excited slices exist as a kind of "single slice". The magnetic resonance data from the individual slices can be extracted therefrom, such as by using a slice-GRAPPA algorithm.

A magnetic resonance sequence that is frequently used generally in clinical magnetic resonance imaging, and which can likewise be understood as an accelerating imaging technique, is the turbo spin echo sequence (TSE sequence). This includes a number of echo trains, in each of which is multiple k-space lines in the phase encoding direction are scanned (filled with data entries) after a single excitation pulse. This is achieved by using a refocusing pulse to refocus the excited nuclear spins after the readout of every k-space line, in order to produce another echo. Compared with the conventional spin echo sequence, the acquisition time is reduced by the number of refocusing echoes in a single echo train (turbo factor).

It has also been proposed to combine multislice imaging (SMS) and TSE sequences in order to be able to acquire two or more slices simultaneously. Whereas the (effective) echo time TE refers to the time between the excitation pulse and the acquisition (sampling) of the magnetic resonance signal at the center of k-space, the repetition time TR is defined as the time between two successive excitation pulses. In combining SMS and TSE it has been found that the minimum repetition time can be reduced, since fewer slices need to be acquired. It should be noted, however, that the minimum repetition time ultimately is often limited not by the total time of all the echo trains, but by the desired image contrast. For example, for T2-weighted imaging, a long repetition time is needed in order for the T1 relaxation to provide the desired T2 contrast. This means that if a repetition time is 5 seconds without multislice imaging, then with an SMS factor of 2 (simultaneous acquisition of two slices), a repetition time of 2.5 seconds would be possible in principle, but this low repetition time cannot be achieved without altering the image contrast to such a degree that the imaging result is no longer clinically acceptable.

Problems can also arise when applying simultaneous multislice imaging to the FLARE T2-weighted TSE sequence (FLAIR—Fluid Attenuated Inversion Recovery). The FLAIR T2-weighted TSE sequence provides a T2-weighted contrast for suppressed magnetic resonance signals from the cerebrospinal fluids (CSF), with the relevant signal suppression being achieved by preceding inversion pulses as preparation pulses and by a relatively long delay (inversion time) of 2.5 seconds between the preparation pulses and the readout module. In this case, the echo trains for two adjacent slices to be acquired are usually output in two different acquisition segments (concatenations) in order to avoid interference effects from the adjacent slices (crosstalk). Using multislice imaging, it would be possible in theory to reduce the number of concatenations, although in practice this would again result in crosstalk between slices. Another disadvantage is that it may not be possible to implement the preparation pulse simultaneously for a number of slices, because peak power restrictions exist (two preparation pulses, one for each single slice, combined into a multiband preparation pulse result in twice the peak power).

With increasing basic field strengths, in particular field strengths greater than 3 T, and greater coverage by the slices to be acquired, the SAR loads constitute another major challenge if the multislice imaging technique is meant to be combined with conventional acquisition techniques, since the increase in the peak power is a multiple of the SMS factor, i.e. the number of slices to be acquired simultaneously. In general, the SAR is proportional to the square of the flip angle.

Moreover, typical magnetic resonance examinations often include the use of a number of TSE sequences having different contrasts. For example, a typical acquisition in the head region of a patient comprises both the conventional T2-weighted TSE imaging and FLAIR T2-weighted TSE imaging. Other combinations of sequences with and without preparation pulses can be applied to other body regions, for instance proton density (PD)/T1/T2 and proton-density STIR, T1-STIR, T2-STIR or proton density and T1-FLAIR.

In view of such commonly occurring combinations, in which magnetic resonance sequences are used that are targeted for different contrasts, some of which sequences are meant to be performed with preparation pulses, some without, US 2017/0108567 A1 proposes a multi-contrast SMS imaging variant. The specific intention of that variant is to apply the at least one preparation pulse only to one of the simultaneously acquired slices, resulting in a multi-contrast dataset containing the contrasts manipulated by the preparation pulse for the one slice, and a conventional weighting for the second slice. In a second repetition, the excitation sequence is reversed, which means that the preparation pulse then acts on the second slice, while the conventionally weighted magnetic resonance data is produced for the first slice. It is thereby possible to make better use of dead times and to avoid peak-power problems with the preparation pulses, which are usually high-power pulses.

The mentioned refocusing pulses, which are intended to produce multiple echoes after a single excitation in order to be able to read out a number of k-space lines after a single excitation, present another problem regarding the peak power/SAR. Imaging known as hyperecho imaging has been proposed in the prior art as a solution to this problem (see, for example, the article by Jürgen Hennig and Klaus Scheffler, "Hyperechoes", Magnetic Resonance in Medicine 46: 6-12 (2001), which later was generalized as TRAPS (smooth transition between steady states); see, for example, the article by Jürgen Hennig, Matthias Weigel and Klaus Scheffler, "Multiecho sequences with variable refocusing flip angles: optimization of signal behavior using smooth transitions between pseudo steady states (TRAPS)", Magnetic Resonance in Medicine 49: 527-535 (2003), and the article by Matthias Weigel, Maxim Zaitsev and Jürgen Hennig, "Inversion recovery prepared turbo spin echo sequences with reduced SAR using smooth transitions between pseudo steady states", Magnetic Resonance in Medicine 57: 631-637 (2007)). These articles propose that, instead of the repeated use of 180° refocusing pulses, the variation in time of the flip angle over the number of refocusing pulses to be radiated is adjusted in order to reduce the SA. The flip angle of the flip-angle variation, which relates to the times at which refocusing pulses are radiated, shall be understood in this context to mean a control parameter that defines the refocusing pulse, specifically its strength. In conjunction with a short, smooth flip-angle preparation stage at the start of every echo train, it is possible to reduce significantly the signal loss compared with applying solely 180° refocusing pulses. A detailed analysis of various TRAPS flip-angle variations and the effects on image contrasts can be found in the dissertation by Matthias Weigel, "Entwicklung, Optimierung und klinische Erprobung von T2-gewichteten Messverfahren mit reduzierter Hochfrequenzleistung für die Kernspintomographie" (Development, optimization and clinical trials of T2-weighted measurement techniques with reduced radio-frequency power), Fakultät für Mathematik und Physik der Albert-Ludwigs-Universität Freiburg im Breisgau, October 2007. It was proposed therein to obtain a suitable flip-angle variation for the refocusing pulses by an optimization process, the first, highly-weighted optimization criterion of which is to minimize the SAR load, while a lower-weighted optimization criterion seeks to produce a maximum possible signal intensity.

SUMMARY OF THE INVENTION

An object of the present invention is to reduce peak powers and the SAR load for patients in simultaneous multislice TSE imaging.

This object is achieved based on a method of the type mentioned in the introduction but wherein, according to the invention a multislice imaging technique is used for simultaneous excitation and readout of at least two slices of a slice group to be acquired, and different flip-angle variations are used in the multislice imaging (compared to the flip-angle variations used for the refocusing) in order to reduce further the SAR of the patient, compared with the use of identical flip-angle variations.

The inventive procedure allows the total SAR during an acquisition of magnetic resonance data in simultaneous multislice imaging (SMS) to be reduced. Basically, the inventive method uses the TRAPS method, described in detail in the documents cited in the introduction, but employs an additional degree of freedom, namely the use of different flip-angle variations for different slices to be acquired simultaneously. It is thereby possible to prevent respective maxima of the flip-angle variations from coinciding with one another, so that refocusing pulses of particularly high power, which hence entail a particularly high SAR load, can be avoided. In addition, the procedure according to the invention can be applied particularly advantageously to multi-contrast acquisitions, such as those discussed, for example, in US 2017/0108567 A1 cited in the introduction. The reason for this is that the different flip-angle variations can cause different signal intensities to arise during the acquisition of the magnetic resonance data, and hence different contrast properties. These subtle differences affect the analysis of the magnetic resonance data far less when they exist anyway between different, desired image contrasts, for instance FLAIR T2-weighted TSE sequences and conventional T2-weighted TSE sequences. Nonetheless, the method according to the invention can also be applied to standard SMS imaging, i.e. in which slices are meant to be acquired simultaneously for the same contrast, although smaller differences in the contrast properties can then arise between slices having different flip-angle variations.

It should also be noted that in the context of the present invention, flip-angle variations can also still be deemed different if essentially identical original variations are used that are, however, offset in time. This will be discussed in greater detail below. In addition, as is conventional in the TRAPS method, the flip-angle variations refer to preset values for the refocusing pulses at times at which a refocusing pulse is meant to be output (not to an actual flip-angle variation of the nuclear spin).

The procedure according to the invention therefore uses different flip-angle variations over time for the refocusing pulses in order to allow a reduced peak power and a reduced SAR in the multislice imaging, in particular a significant improvement compared with using identical flip-angle schemes for all the slices to be acquired simultaneously. This opens additional applications for the multislice imaging technique (SMS), increases the slice coverage and allows the use of multislice imaging techniques even at higher main magnetic field strengths, for instance of more than 3 T, in particular of 7 or more T.

The magnetic resonance sequence is preferably a TSE sequence, in which it has been found that the effectiveness is greatest for spin echo variants that normally require extremely high flip angles for the refocusing pulses. Nevertheless, the method can also be applied to other magnetic resonance sequences that can be employed in the multislice imaging technique.

As already mentioned, according to a preferred embodiment of the present invention, each slice to be acquired is acquired using a number of different contrasts, wherein in the multislice imaging technique, the different slices to be measured simultaneously are each acquired using another of the contrasts, and the contrasts are permutated in subsequent repetitions of the same slices such that each slice has been acquired using every contrast, wherein a dedicated flip-angle variation is defined for each contrast and employed for each measurement using this contrast. Effectively, this extends the procedure described in US 2017/0108567 A1, since, for two slices, for example, initially the first slice is acquired using the first contrast, the second slice using the second contrast, after which, in a further concatenation, the first slice is measured using the second contrast and the second slice using the first contrast. In this process, the flip-angle variations are assigned to the different desired contrasts, such as conventionally T2-weighted and FLAIR T2-weighted, thereby avoiding within a magnetic resonance dataset for one contrast, a variation in signal intensities and hence contrast properties as a result of different flip-angle variations. At least one, but not all, of the different contrasts is produced by emitting a preparation pulse that acts on the slice concerned. This hence avoids the simultaneous output of preparation pulses for all the slices to be excited, thereby in this case again avoiding as far as possible peak powers and increased SAR, as was proposed in US 2017/0108567 A1. As an extension to this procedure, different flip-angle variations are used for the echo trains for the slices to be acquired.

In another embodiment of the present invention, flip-angle variations leading to different echo times are used, wherein the excitation signals and hence the start times of the flip-angle variations for the different slices are radiated at a time offset that equals an integer multiple of the difference in the echo times, so that the echo times are reached at the same point in time during the magnetic resonance sequence. This is based on the knowledge that flip angles that are less than 180° result in a portion of the $M_{xy}$ magnetization being stored along the z-axis, with the result that the T2-decay is extended and the echo time has to be increased in order to achieve a contrast that is comparable to magnetic resonance sequences having 180° flip angles for the refocusing pulses. The increase in the echo time depends here on the flip-angle variation used. It is therefore proposed to offset mutually in time the echo trains, specifically the radiation of the refocusing pulses, for the slices to be acquired simultaneously, in order to avoid as far as possible the overlap of refocusing pulses that have large flip angles.

US 2017/0315202 A1 proposes a corresponding specific procedure for a different application. This involves simultaneous multislice TSE imaging, in which, as a result of different desired contrasts, different echo times exist for all the slices to be acquired and yet the readout periods for the slices to be acquired simultaneously are meant to be made to coincide. This procedure can therefore be applied also in the context of the present invention, in which, in the context of the present invention, the offset in the echo times arises from, or is modified by, the different flip-angle variations over time, which are proposed here for the first time. By using different flip-angle variations, hence different TRAPS schemes for all the slices to be acquired, in particular two slices, there is a difference in the effective echo times of the two slices. By mutually offsetting the excitation pulses and thus the start time of the refocusing pulses, it is possible to achieve identical times at which the echo time is reached for both slices. At the same time, the overlap of refocusing pulses that have large flip angles is significantly reduced for the slices to be acquired.

In a specific embodiment, identical original variations are used for the flip-angle variations, the maxima of which are mutually offset because of the different start times. For example, the original variation can be determined by individual optimization, for instance as described in the cited dissertation by Matthias Weigel, after which an offset is selected, for instance an offset defined by the difference in the echo times or a multiple thereof, so that the original variations start at different start times and hence constitute different flip-angle variations, the maxima of which do not coincide if at all possible.

In another exemplary variant of the present invention, for the flip-angle variation having the later start time, a constant first flip-angle value, in particular 180°, is selected, whereas the flip-angle variation having the earlier start time decreases from an initial value, in particular 180°, to a second flip-angle value, which is chosen to be lower than the first flip-angle value, in particular reaching the second flip-angle value by the start time of the second flip-angle variation. As the research into the TRAPS method found, it is advantageous to use relatively large flip angles for the first refocusing pulses (TRAPS preparation stage). The advantage of a mutual offset in the start times is apparent already in this case, because the flip-angle variation starting first can already have fallen to a lower value when the second flip-angle variation starts, generally with large flip-angle values. As the specific example discussed here shows, it is entirely conceivable not to use TRAPS for one of the slices to be acquired and to choose a flip-angle variation that constantly uses 180°. Using a flip-angle variation that differs from this for the at least one additional slice to be acquired results anyway in differences in the echo times, which can be used accordingly.

The earlier start time of the refocusing pulses for at least one of the slices means that some echoes, albeit those of low signal intensity, come to lie outside the acquisition period, i.e. are output in a period in which the at least one additional slice has not even been excited yet. Said early echoes of low intensity can generally be discarded. In another embodiment of the invention, echoes lying outside the acquisition period as a result of the offset are used for measuring a navigator. Said navigators are employed in particular in magnetic resonance examinations in which movements may arise in the region of interest in the patient, where lower signal intensities are actually sufficient for such navigators, which is why at least some of the early echoes can be put to use.

The flip-angle variations can advantageously be determined in an optimization process, by a controller of the magnetic resonance apparatus serving as a processing device, in order to minimize the manual interaction with a user, although in principle the user could also define these flip-angle variations at least in part, for which purpose a suitable input device of the magnetic resonance apparatus can be used. In a specific embodiment, the objective function of the optimization specifies minimizing the SAR and, with lower weighting, a high signal intensity in the measurement, and/or that a maximum transmitter voltage for the combined refocusing pulses and/or a minimum flip-angle value for each slice and/or a maximum rate of change of flip angle are used as boundary conditions. Basically the procedure known in the prior art for a single flip-angle variation can be followed here, although now a larger number of parameters to be optimized (flip angles of the refocusing pulses) are available because there are two flip-angle variations. A maximum permitted transmitter voltage for the refocusing pulses can be specified as an additional boundary condition, i.e. the sum of the flip angles can be kept below a threshold value. This avoids peak powers that are too high.

In order to facilitate finding different flip-angle variations by the optimization algorithm used in the optimization process, different initial variations are used as initial values for the parameters to be optimized, i.e. for the flip-angle variations, in particular depending on desired different contrasts. Such initial variations thus may, for example, be stored in a database, assigned to measurements and/or contrasts to be implemented, and/or can be generated by a generation algorithm, such as an artificial intelligence generation algorithm. It is also conceivable to generate initial variations according to a user input. Initial variations contain initial values for the parameters to be optimized, in this case the flip angles of the refocusing pulses. It should be noted that another variant for finding different angle variations may also be a suitable modification to the objective function, for instance by aiming for high signal intensities for different tissue types. For example, for one slice, optimization may be towards a maximum intensity for a first tissue, and for a slice to be acquired simultaneously, toward a maximum intensity for a different tissue.

The present invention concerns only the method, but also to a magnetic resonance apparatus, which has a controller (control computer) designed to perform the method according to the invention. All the statements relating to the method according to the invention apply analogously to the magnetic resonance apparatus according to the invention, and therefore the aforementioned advantages are likewise achieved by the apparatus. The controller can therefore include a flip-angle variation determination processor in addition to other known components, for instance a sequence controller for performing the acquisitions. The controller may be, or include, a processor, and accordingly may also include at least one memory device.

The present invention also concerns a non-transitory, computer-readable data storage medium encoded with programming instructions that, when the storage medium is loaded into a control computer or computer system of an magnetic resonance apparatus, cause the control computer or computer system to operate the magnetic resonance apparatus so as to implement any or all embodiments of the method according to the invention, as described above.

The data storage medium may be a CD-ROM.

DESCRIPTION OF THE PREFERRED EMBODIMENTS

The following exemplary embodiments relate purely by example to the acquisition of magnetic resonance data in a slice stack, where the region of interest is the human brain, as an example. Magnetic resonance data from all the slices is meant to be acquired for two different contrasts, namely using a FLAIR T2-weighted TSE sequence and a conventional T2-weighted TSE sequence. This means that a preparation pulse (inversion pulse) is needed for one of the contrasts, in this case the FLAIR method. The intention here is also to use a multislice imaging technique (SMS) employing simultaneous acquisition of two slices, in which the one slice is meant to be acquired using the first contrast, the other slice using the second contrast. In a later concatenation, the reverse combination is then meant to be acquired, i.e. the first slice using the second contrast, simultaneously the second slice using the first contrast (see also US 2017/0108567 A1). As regards the preparation pulse, the required peak power (defined by the transmitter voltage for the preparation pulse) and the SAR are thereby kept low. In order to keep the SAR for the patient low also with regard to the refocusing pulses of the TSE sequence as the magnetic resonance sequence, it is intended here to use the TRAPS technique, i.e. the refocusing pulses of the TSE sequence do not use throughout a flip angle of 180° but follow a flip-angle variation. According to the present invention, in order to reduce further the SAR for the patient, different flip-angle variations from the TRAPS technique are used for each of the two slices of the slice stack that are to be acquired simultaneously.

These flip-angle variations are defined in a step S1, in this case in an automated manner by using an optimization technique in which the objective function is based primarily on minimizing the SAR, secondarily on a high signal intensity. A maximum occurring total flip angle of the flip-angle variations, i.e. a maximum transmitter voltage to be used for a refocusing pulse, and also a minimum flip angle value for each slice and a maximum rate of change of flip angle are defined as boundary conditions. In addition, different initial variations are advantageously used for the flip-angle variations, for example those for which different tissues are imaged at high signal intensity, for example in the present case gray and white brain matter. Obviously different initial variations can also be defined manually and/or by other means, for instance using a suitable database; different initial variations can also be produced by a time offset to the start time of identical original variations, something that will be discussed in greater detail below.

Figure 2:
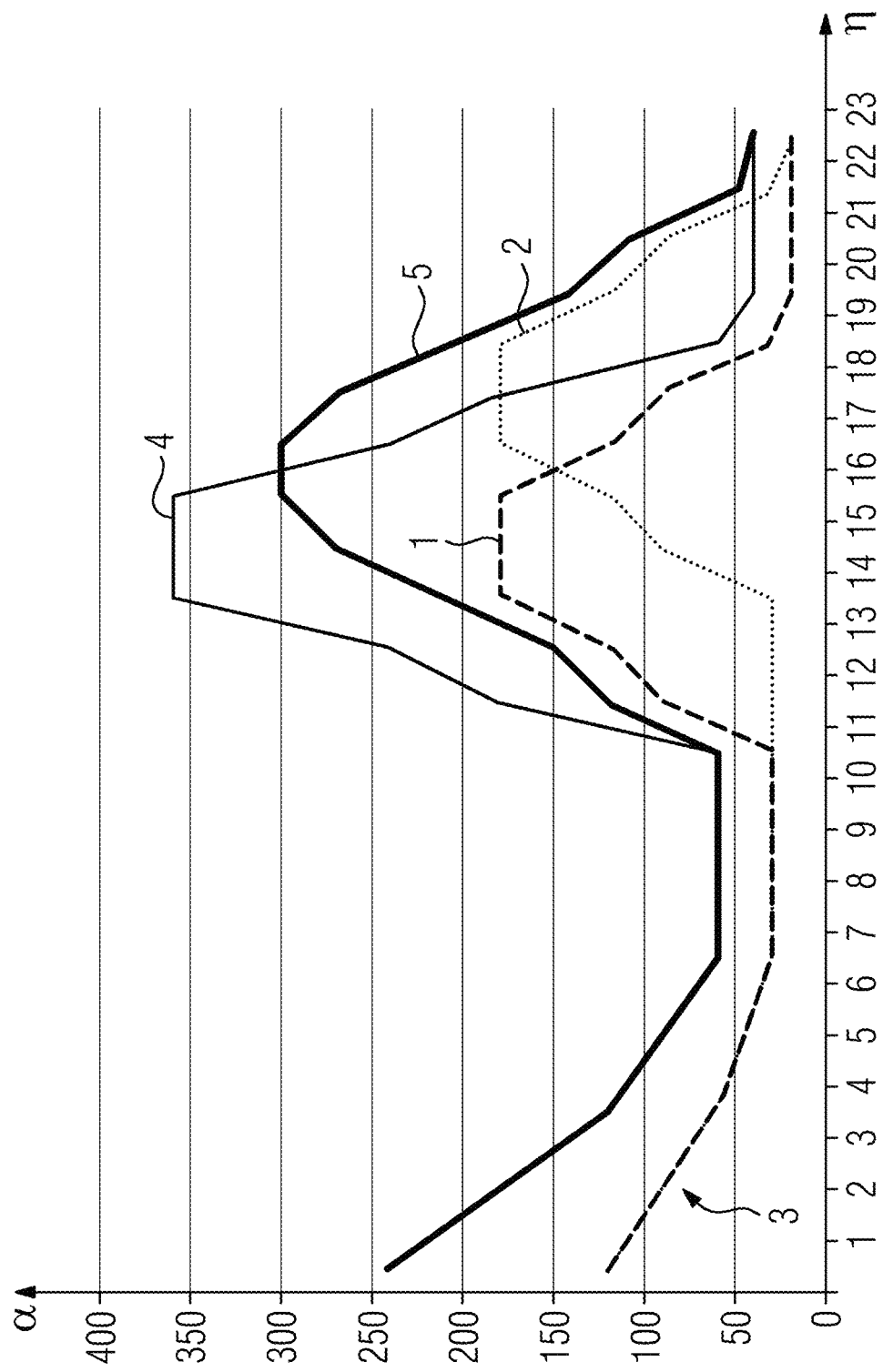
FIG. 2 shows first possible flip-angle variations in accordance with the invention.

FIG. 2 shows a first example of usable flip-angle variations 1, 2 when the start times are not mutually offset, i.e. the refocusing pulses for both slices start at the same time within the magnetic resonance sequence. In the graph of FIG. 2, the flip angle α to be used in the corresponding refocusing pulse is plotted against the serial number of the refocusing pulse n. The dashed flip-angle variation 1 is here assigned to a first contrast, for instance FLAIR; the flip-angle variation 2 shown dotted is assigned to the second contrast of the multi-contrast measurement, so in the present case to the conventional T2 contrast. This means specifically that a combination of two slices is acquired twice: first the first slice using the first flip-angle variation 1, while the inversion pulse acts on the slice as the preparation pulse, and the second slice using the second flip-angle variation 2; then the first slice using the second flip-angle variation 2, and the second slice using the flip-angle variation 1, while the inversion pulse acts on the second slice as the preparation pulse. The same contrast is thereby always achieved for the resultant magnetic resonance datasets for the different slices, each of which datasets is associated with one contrast; subtle differences in the signal intensity when comparing the two magnetic resonance datasets are of no consequence for the analysis. This also applies with regard to the further possible flip-angle variations that are discussed here.

As can be seen, both flip-angle variations 1, 2 in FIG. 2 are based on an identical original shape, in which, after a preparation segment 3 containing slowly falling flip angles, a plateau is reached at low flip angles, whereupon the flip angle is increased again temporarily in a defined structure. In this figure, the time at which this structure starts is chosen to be different for the two flip-angle variations 1, 2 in order to keep lower the resultant peak powers and hence the SAR load for the patient. This effect is illustrated in FIG. 2 by the total variations 4 and 5 shown as continuous lines. The variation 4 is a comparison variation that would arise when using identical flip-angle variations for both slices, and in the present case is twice the flip-angle variation 1. As can be seen, the maximum of the individual flip-angle variations 1, 2 in this example lies at 180°, and therefore a very high peak power, equivalent to a flip angle of 360°, would be needed for refocusing pulses in the region of this maximum. The offset in the maximum-structures of the flip-angle variations 1, 2, however, produces the total variation 5, which involves significantly lower peak powers, i.e. transmitter voltages, and preferably a distributed, lower SAR load.

Since the use of different flip-angle variations means that different echo times TE must be selected, for instance an echo time TE1 for one flip-angle variation, an echo time TE2 for another flip-angle variation, then mutually offsetting the actual excitation pulses not only allows the ends of the echo times TE1, TE2 to coincide at a certain time of the magnetic resonance sequence in the acquisition period but also advantageously achieves that the refocusing pulses for the slice excited earlier are radiated at earlier times, which results in a natural mutual offset in the start times for the output of the refocusing pulses and hence in the flip-angle variations, so that, for example, corresponding flip-angle maxima can also be mutually offset in this manner.

Figure 3:
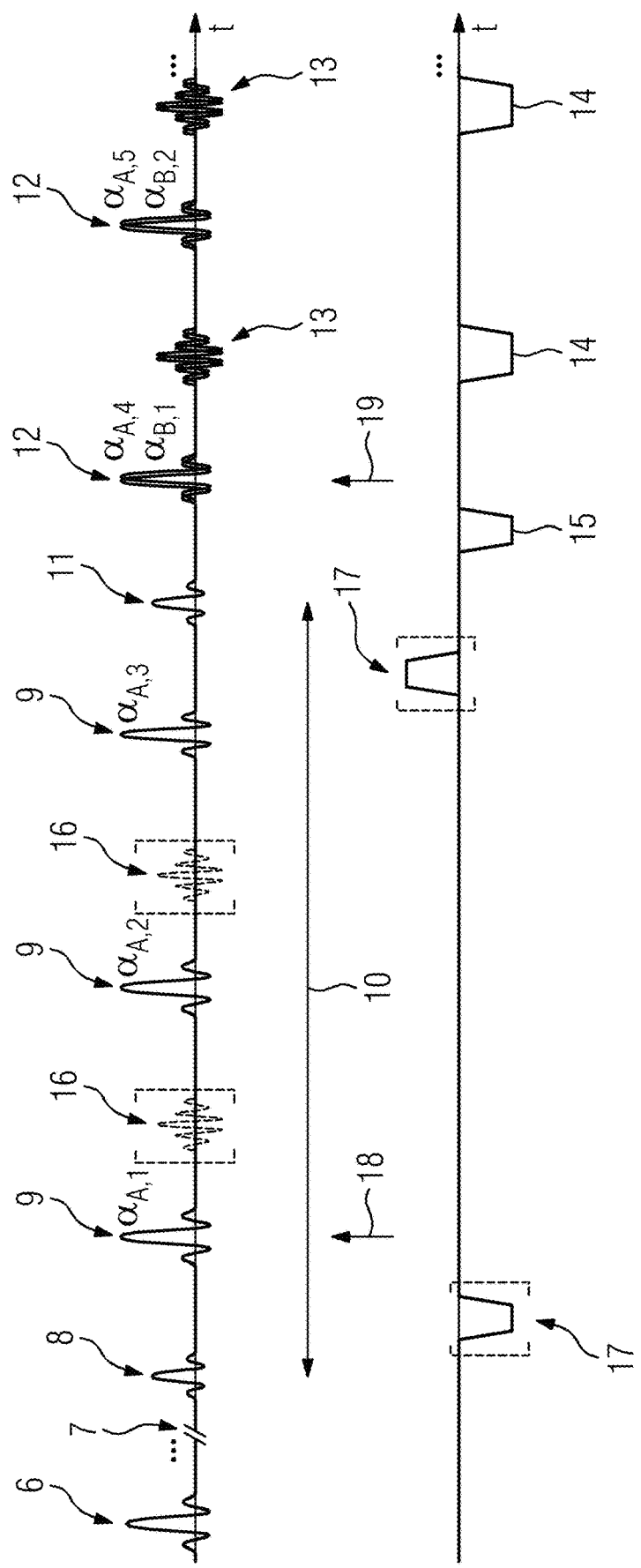
FIG. 3 shows a time sequence of pulses of a magnetic resonance sequence used in accordance with the invention.

FIG. 3 explains this by the example of showing relevant components of the pulses of the magnetic resonance sequence used. The top plot in this figure shows radio frequency pulses to be radiated, and magnetic resonance signals, i.e. echoes, being received during the readout, while the bottom plot against time shows readout gradient pulses. As is generally known, other gradient pulses can obviously also be activated, but are not shown here for clarity.

FIG. 3 shows first in a clear time interval before the later radio frequency pulses, the preparation pulse 6, here in the form of an inversion pulse, which acts only on one of the slices to be acquired simultaneously. After a delay (inversion time), indicated by the discontinuity 7, then first the excitation pulse 8 is radiated, which acts on the first slice. At a suitable interval after the radiation of the excitation pulse 8 accordingly begin the refocusing pulses 9 for the first slice, which accordingly also initially act only on this slice. Only at a time interval 10, which here equals the difference in the echo times TE1-TE2, is then output the excitation pulse 11 then radiated for the second slice. Accordingly, all the subsequent refocusing pulses 12, as multiband refocusing pulses, relate both to the first slice and to the second slice.

Corresponding common echoes 13 (magnetic resonance signals) are acquired simultaneously by means of suitable readout gradient pulses 14. The readout gradient pulse 15 is a pre-phaser.

As can be seen in this example, echoes 16 from the first slice also occur after the refocusing pulses 9 that act solely on this slice, although these echoes can be discarded. It is also conceivable, however, as indicated by the optionally shown pre-phaser gradient pulses 17, to use these echoes 16 for measuring a navigator, which then is usually acquired as a projection, i.e. no dedicated phase-encoding gradient pulse is needed.

As can be seen in FIG. 3, the start time 18 of the flip-angle variation for the first slice is earlier than the start time 19 of the flip-angle variation for the second slice. This is also indicated by the respective flip angles $\alpha_{A,i}$ and $\alpha_{B,j}$ shown beside the refocusing pulses 9, 12, again also emphasizing the disparity in the flip-angle variations.

This time offset in the start times 18, 19 can be exploited in various ways. One example of this is that already a "natural" offset in the maximum-structures, for instance of the flip-angle variations 1, 2 of FIG. 2, can already take place, with the result that maxima no longer coincide. Another is to use also simpler flip-angle variations, for instance those in which the maximum flip angles occur in the preparation region 3 of the corresponding flip-angle variations, with the length of these preparation time periods being selected such that the preparation is finished if at all possible before the start time 19 of the flip-angle region that starts later is reached.

Figure 4:
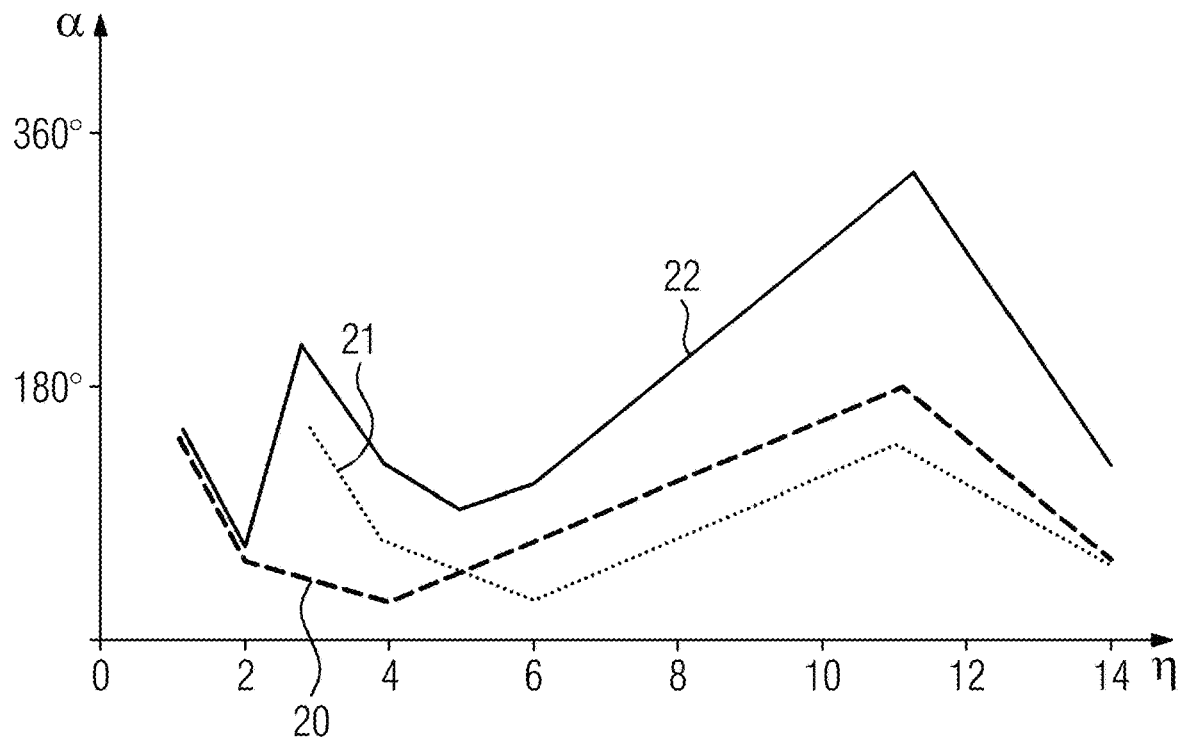
FIG. 4 shows second possible flip-angle variations in accordance with the invention.
Figure 5:
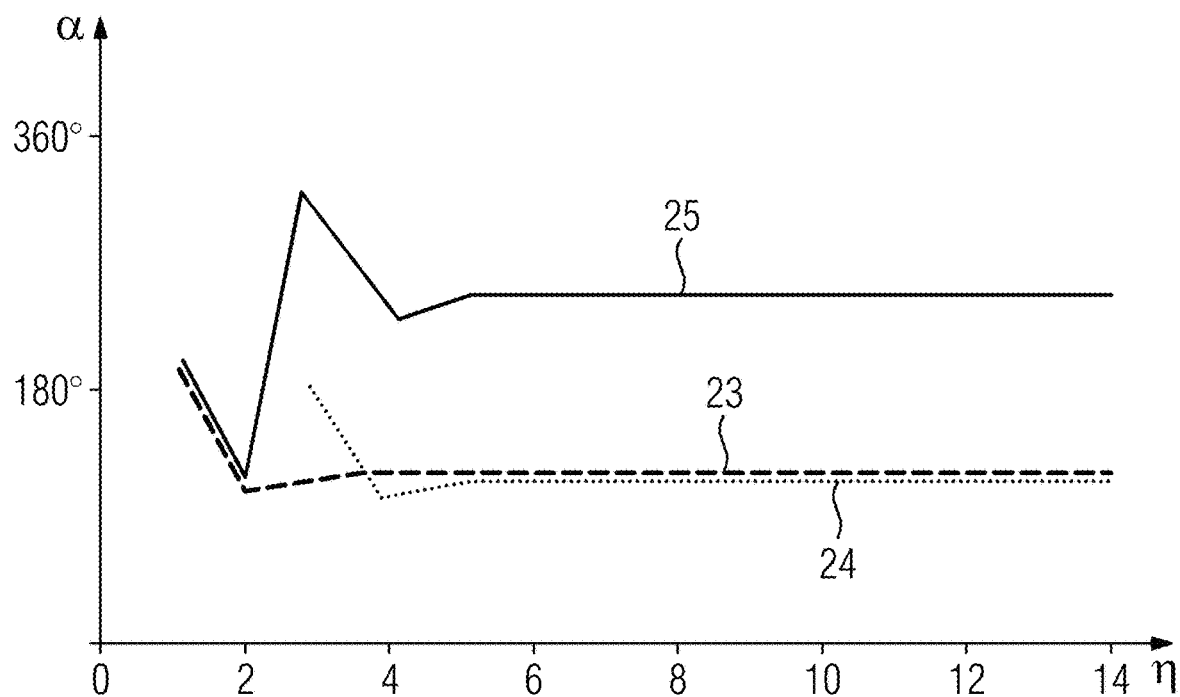
FIG. 5 shows third possible flip-angle variations in accordance with the invention.
Figure 6:
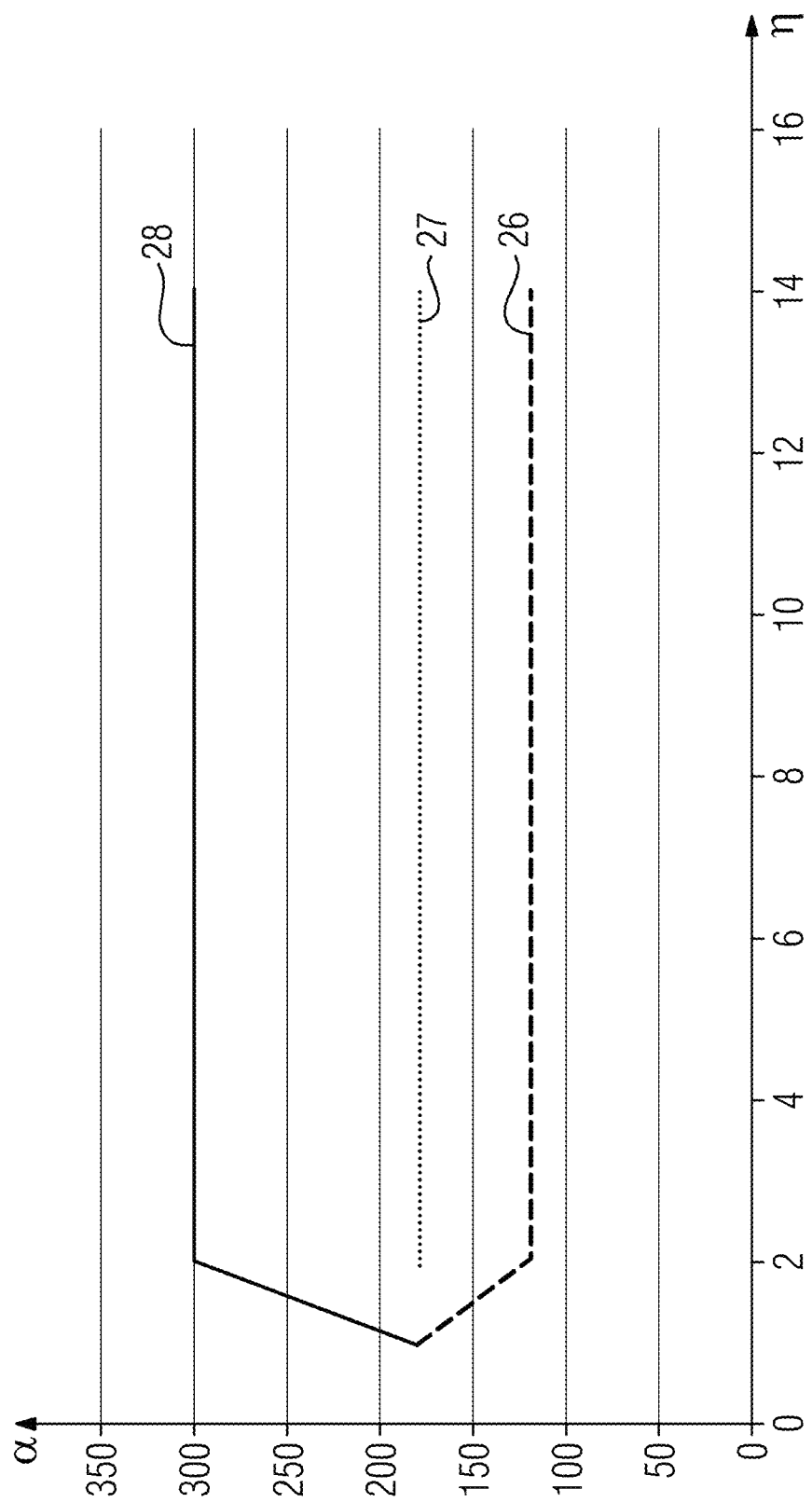
FIG. 6 shows fourth possible flip-angle variations in accordance with the invention.

FIGS. 4, 5 and 6 show further examples of possible flip-angle variations.

In the example of FIG. 4, the first flip-angle variation 20 is again shown dashed, the second flip-angle variation 21 dotted. The resultant total, which defines the peak pulse voltage, is again shown as a continuous-line total variation 22. For the flip-angle variations 20, 21, the maximum flip angles occur at the start, i.e. in the respective preparation regions, which in the present example are separated from each other by the time offset in the start times 18, 19. Since smaller flip angles are used in the later variation, in this example it was actually possible in practice to make the maxima coincide again.

FIG. 5 shows another example of flip-angle variations 23, 24, again shown dashed/dotted. Both flip-angle variations, after the preparation stage containing higher preparation angles, tend towards a constant, lower, identical flip angle. It is again clear in this case from the total variation 25, represented as a continuous line, that the separation in time of the preparation stages 3 avoids particularly high peak powers/SAR loads.

Finally, FIG. 6 is an example in which the TRAPS method is applied only for one of the slices, since only for the first flip-angle variation 26 do variable flip angles of less than 180° ever occur. The second flip-angle variation 27 (dotted), which starts later, remains constantly at 180°, i.e. corresponds to non-use of the TRAPS method. The later start point 19 of the second flip-angle variation 27 means, however, that it is possible to start at 180° in the preparation phase of the first flip-angle variation 26 without a problem, since this does not force peak powers, as shown by the total variation 28 represented by a continuous line.

Figure 1:
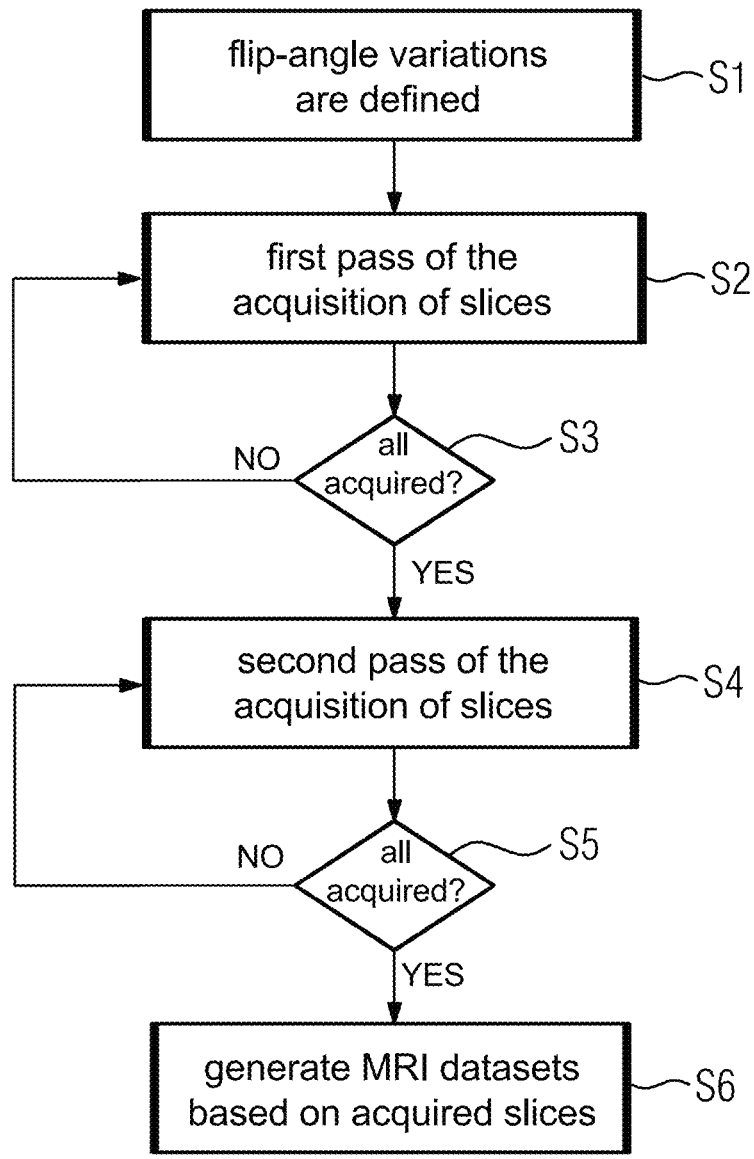
FIG. 1 is a flowchart of an exemplary embodiment of the method according to the invention.

Returning to FIG. 1, then in a step S2 begins a first pass of the acquisition of two slices of the slice stack at a time, wherein in each pass, one of the slices is acquired using the first contrast, the other using the second contrast, until, as represented by the step S3, all the slices of the slice stack have been acquired.

Then in a further concatenation, starting in the step S4, magnetic resonance data from the same combination of slices is again acquired, although now the contrasts are swapped over in each case, i.e. the preparation pulse 6 acts on every slice that in the first concatenation (step S2, S3) it did not act on. In addition, the flip-angle variations used in each case are swapped over, since they are assigned to a contrast. According to step S5, also this acquisition is performed until again all the slices of the slice stack have been acquired.

Then as a result, in a step S6, magnetic resonance data from all the slices is available for both contrasts, with the simultaneous multislice imaging technique having been employed efficiently. Then, as is standard practice, magnetic resonance data from different slices from the shared acquisition processes can be separated, for instance using the slice GRAPPA algorithm, in the step S6, which symbolizes in general the further processing into magnetic resonance image datasets.

Figure 7:
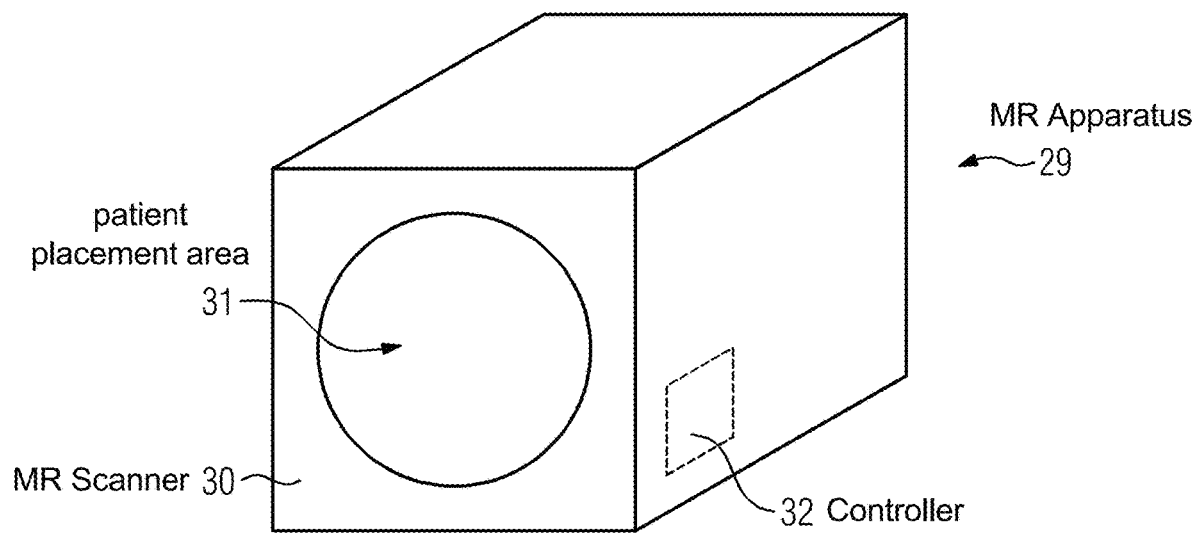
FIG. 7 is a block diagram of a magnetic resonance apparatus according to the invention.

FIG. 7 shows a block diagram of a magnetic resonance apparatus 29 according to the invention. This has, as is generally known, an MR data acquisition scanner that has a basic field magnet, in which a patient placement area 31 proceeds, into which a patient can be moved using a patient bed (not shown here). A radio-frequency coil arrangement and a gradient coil arrangement are also provided, surrounding the patient placement area 31.

A controller 32 operates the magnetic resonance apparatus 29, and accordingly has a sequence controller for controlling the acquisition of magnetic resonance data, by controlling the activation of suitable pulses in a coordinated manner. In addition, a flip-angle variation determination processor is provided, which is designed to determine in accordance with the method according to the invention, the respective different flip-angle variations for different slices to be acquired simultaneously when using a simultaneous multislice imaging technique.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) apparatus, comprising:
    using a computer to operate the MR apparatus so as to execute an MR sequence, in order to acquire MR data from a subject, comprising radiating at least one excitation pulse and, thereafter, radiating a plurality of refocusing pulses during a readout period in which said MR data are acquired, with said refocusing pulses having respective strengths that vary according to a refocusing flip angle variation over time that minimizes a specific absorption rate (SAR) of the subject; and
    using said computer to operate said MR apparatus so as to execute a multislice imaging technique in which at least two slices of a slice group of the subject are simultaneously excited by an excitation pulse and a following plurality of refocusing pulses and MR data are simultaneously read out therefrom, with said flip angle variations for said simultaneous excitation being used, which are, at same points in time, different for respective slices of said at least two slices, so as to reduce said SAR compared to an SAR that would occur if said flip angle variations were the same in said at least two slices at same points in time.

2. A method as claimed in claim 1 comprising using said computer to operate said MR apparatus to execute a TSE sequence as said MR sequence.

3. A method as claimed in claim 1 comprising using said computer to operate said MR apparatus in said multislice imaging technique so that MR signals that are acquired simultaneously from different slices represent respectively different contrasts, among a plurality of different contrasts, and repeating execution of said multislice imaging technique with the respective contrasts for respective slices being permutated until each slice that has been simultaneously acquired has been acquired with each contrast among said plurality of different contrasts, and using a dedicated flip angle variation for each contrast.

4. A method as claimed in claim 3 using said computer to operate said MR apparatus so as to radiate a preparation pulse that acts on a respective slice among the slices that are simultaneously executed, that sets at least one, but not all, of said different contrasts in said plurality of contrasts.

5. A method as claimed in claim 1 comprising using said computer to operate said MR apparatus with said flip angle variations producing different echo times, and with said excitation pulses in said multislice imaging technique, and therefore respective start times of the flip angle variations, for different slices being radiated at a time offset that is an integer multiple of a difference in said echo times, thereby causing said echo times to occur at a same point in time in the different slices during said MR sequence.

6. A method as claimed in claim 5 comprising using identical original variations for said flip angle variations, having respective maxima that are mutually offset due to said different start times.

7. A method as claimed in claim 5 comprising for a flip angle variation having a later start time, using a constant first flip angle value, and for a flip angle variation having an earlier start time, using flip angle values that decrease from an initial value to a second flip angle value.

8. A method as claimed in claim 7 wherein said first flip angle variation is 180° and said initial value is 180°.

9. A method as claimed in claim 7 wherein said second flip angle value is lower than said first flip angle value.

10. A method as claimed in claim 7 wherein said second flip angle value of said flip angle variations having said earlier start time, occurs no later than said start time of said flip angle variation having said later start time.

11. A method as claimed in claim 5 comprising using said computer to operate said MR apparatus so as to acquire a navigator dataset from respective echoes that occur outside of an acquisition period, due to said offset.

12. A method as claimed in claim 1 comprising, in said computer, executing an optimization algorithm in order to determine said flip angle variations.

13. A method as claimed in claim 12 comprising executing said optimization algorithm with minimization of said SAR being an objective function thereof and, with a lower weighting than a weighting given to said SAR, also using achievement of a high signal intensity.

14. A method as claimed in claim 13 comprising, in said optimization algorithm, using a boundary condition selected from the group consisting of a maximum transmitter voltage for a totality of the refocusing pulses, a minimum flip angle value for each slice, and a maximum rate of change of the flip angles.

15. A method as claimed in claim 12 comprising using different initial variations for said flip angle variations.

16. A method as claimed in claim 15 comprising using said different initial variations that depend on desired different contrasts.

17. A magnetic resonance (MR) apparatus comprising:
an MR data acquisition scanner; and
a computer configured to:
  operate the MR scanner so as to execute an MR sequence, in order to acquire MR data from a subject, comprising radiating at least one excitation pulse and, thereafter, radiating a plurality of refocusing pulses during a readout period in which said MR data are acquired, with said refocusing pulses having respective strengths that vary according to a refocusing flip angle variation over time that minimizes a specific absorption rate (SAR) of the subject; and
  operate said MR scanner so as to execute a multislice imaging technique in which at least two slices of a slice group of the subject are simultaneously excited by an excitation pulse and a following plurality of refocusing pulses and MR data are simultaneously read out therefrom, with said flip angle variations for said simultaneous excitation being used, which are, at same points in time, different for respective slices of said at least two slices, so as to reduce said SAR compared to an SAR that would occur if said flip angle variations were the same in said at least two slices at same points in time.

18. A non-transitory, computer-readable data storage medium encoded with programming instructions, said storage medium being loaded into a computer of a magnetic resonance (MR) apparatus, and said programming instructions causing said computer to operate said MR apparatus to:
  execute an MR sequence, in order to acquire MR data from a subject, comprising radiating at least one excitation pulse and, thereafter, radiating a plurality of refocusing pulses during a readout period in which said MR data are acquired, with said refocusing pulses having respective strengths that vary according to a refocusing flip angle variation over time that minimizes a specific absorption rate (SAR) of the subject; and
  execute a multislice imaging technique in which at least two slices of a slice group of the subject are simultaneously excited by an excitation pulse and a following plurality of refocusing pulses and MR data are simultaneously read out therefrom, with said flip angle variations for said simultaneous excitation being used, which are, at same points in time, different for respective slices of said at least two slices, so as to reduce said SAR compared to an SAR that would occur if said flip angle variations were the same in said at least two slices at same points in time.

* * * * *